INTEGRATED RESISTANCE-CAPACITANCE SEMICONDUCTOR
FREQUENCY SELECTIVE FILTER

Filed Jan. 23, 1963

INVENTORS.
HIROE OSAFUNE
ICHIEMON SASAKI
TOSHIO KUROSAWA
BY
Hopgood & Calimafde
ATTORNEYS.

3,233,196
Patented Feb. 1, 1966

1

3,233,196

INTEGRATED RESISTANCE-CAPACITANCE SEMICONDUCTOR FREQUENCY SELECTIVE FILTER

Hiroe Osafune, Ichiemon Sasaki, and Toshio Kurosawa, Tokyo, Japan, assignors to Nippon Electric Company Limited, Tokyo, Japan, a corporation of Japan Filed Jan. 23, 1963, Ser. No. 253,472
Claims priority, application Japan, Jan. 30, 1962, 3,451/62
2 Claims. (Cl. 333—70)

This invention relates to semiconductors and particularly to such devices of extremely small size which include a capacitance as a part of the device.

As those knowledgeable in the art are aware, integrated semiconductor devices of very small size which comprise complete electronic circuits have been available commercially for some time. Such devices which comprise a band-elimination filter have been constructed in the past by forming the capacitance element with the aid of a single P-N junction. In these devices, however, it is difficult to achieve the desired value of capacitance due to size limitations. Furthermore, when a relatively low elimination frequency is desired, it has been necessary in the past to increase the physical size of the device in order to obtain the necessary increased value of the capacitance. Such condition is disadvantageous when it is necessary to maintain the equipment with which the filter device is to be used, as small and light as possible.

Accordingly, it is an object of this invention to provide an integrated semiconductor device having a capacitance element therein which is substantially smaller than corresponding prior art devices having an equivalent capacitance value.

Figure 1:
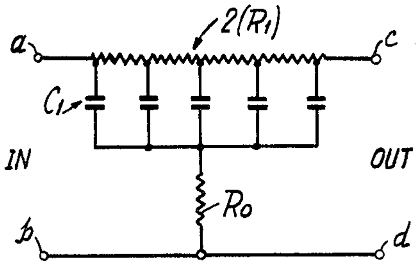
Figure 2:
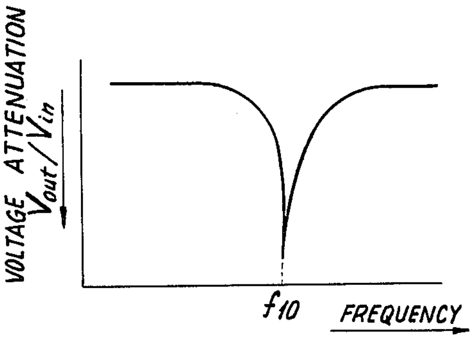
Figure 3:
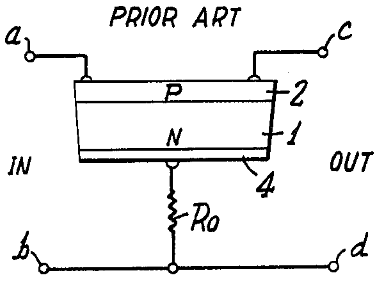
Figure 4:
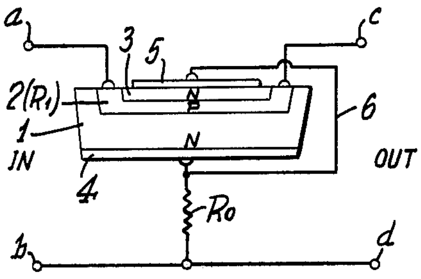

All of the objects, features and advantages of the invention and the manner of attaining them will become more apparent and the invention itself will be best understood by reference to the following description of an embodiment of the invention taken in conjunction with the accompanying drawing, in which:

FIG. 1 shows a band-elimination filter circuit employing resistance and capacitance which may be produced in accordance with the teachings of this invention;

FIG. 2 graphically illustrates the frequency characteristic of the circuit shown in FIG. 1;

FIG. 3 illustrates a conventional device for producing the circuit shown in FIG. 1, and FIG. 4 shows a construction for producing the circuit of FIG. 1 in accordance with the principles of the invention.

In the different figures, like numerals denote the same or equivalent parts.

In accordance with the present invention, the capacitance within an integrated semiconductor device is improved by approximately a factor of two by employing multiple P-N junctions in sandwich form in contrast to the utilization of a single P-N junction conventionally used. The device comprises a plurality of layers or regions, selected regions being coated with a metallic film. The various regions and films are suitably disposed with respect to each other and connected to form a circuit in which the capacitance per unit length is twice that of a single junction device of comparable size.

Referring now specifically to the drawings, FIG. 1 illustrates one band-elimination filter which can be produced in accordance with this invention, while FIG. 2 denotes its characteristic in which the ratio of the output voltage to the input voltage is expressed as a function of frequency. When the ratio of the resistances $$R_1/R_0=17.8$$

the elimination frequency $f_{10}$ of the filter of FIG. 1 is given by the mathematical relation $$5.6\times\frac{1}{R_1C_1}$$

in other words, the elimination frequency $f_{10}$ is proportional to $(R_1C_1)^{-1}$.

FIG. 3 illustrates the conventional construction employed for producing the circuit shown in FIG. 1, in which the transverse resistance of the P region 2 forms the resistance $R_1$ in FIG. 1. For that purpose, wires *a* and *c* are suitably connected at opposite ends of the region 2. The capacity of the P-N junction forms the capacitance $C_1$ represented by the five capacitors shown in FIG. 1. A contact metal layer 4 is formed on the N region 1 to which the resistance $R_0$ is externally connected. The terminals *b* and *d* are connected to one end of the resistance $R_0$ and the circuit of FIG. 1 is formed. Terminals *a* and *b* serve as input terminals, while the terminals *c* and *d* serve as output terminals. It will be noted that in the construction of FIG. 3, the capacitance $C_1$ is formed from a single P-N junction.

FIG. 4 illustrates a construction in accordance with the invention for producing the circuit of FIG. 1. In this construction N-type silicon, for example, forms the region or body 1. A P-type region 2 is formed on the upper portion of the region or body 1 and an N-type region 3 is then formed on the region 2. The transverse resistance of the P-type region 2 between two N regions 1 and 3 forms the resistance $R_1$. For that purpose, wires *a* and *c* are suitably connected at both ends of the region 2. Both of these N regions are provided with metallic layers 4 and 5 respectively, which make electrical contact on substantially the entire surface of the regions 1 and 3 respectively, making the resistances in the transverse direction in their interiors negligible. The metallic layers 4 and 5 are connected with a lead wire 6 or may be connected together by any other suitable means. In the same manner as above, a resistance $R_0$ is externally connected to the N-type region 1, and terminals *b* and *d* are provided at one end of this resistance. In the construction of FIG. 4, the P-N capacitance junctions 2–1 and 2–3 are arranged in parallel with the resistance $R_1$ so that the capacitance per unit length becomes twice that achieved by conventional devices of this type. Consequently, the selected elimination frequency $f_{10}$ is reduced to one-half of the normal value of the conventional arrangement for a given size device. Obviously, when the principles of this invention are applied to an integrated semiconductor device of the band-pass filter type, the selected band-pass frequency will also be reduced to one-half the normal value achieved by conventional devices. This advantage, stated differently, allows approximately 100% reduction in size for a device requiring a given capacitance value.

Although the specific description above employs a three layer P-N junction, it should be appreciated that various

2 other circuits and characteristics can be obtained by making other multiple layer constructions and configurations, and by changing the connections in various ways.

While the foregoing description sets forth the principles of the invention in connection with specific apparatus, it is to be understood that the description is made only by way of example and not as a limitation of the scope of the invention as set forth in the objects thereof and in the accompanying claims.

What is claimed is:

1. A frequency selective R.C. filter comprising an integrated semiconductor device having
   a first region of semiconductor material of given type conductivity,
   a region of semiconductor material of opposite type conductivity in contact with said given type conductivity material to thereby form a first P-N capacitance junction therewith,
   a second region of semiconductor material of given type conductivity also in contact with said opposite type conductivity material to thereby form a second capacitance P-N junction therewith,
   a film of conductive material disposed on a surface of each region of said given type conductivity material, whereby a capacitor is formed between said region of opposite type conductivity and each of said films,
   means electrically connecting said conductive films to one another to thereby connect said capacitors in parallel relationship to provide a capacitance value approximately twice the normal value achieved without said conductive films,
   a pair of terminals, said terminals being in contact with said region of opposite type conductivity at spaced points thereon,
   and a third terminal connected to one of said regions of given type conductivity,
   whereby an electrical circuit is formed between said terminals wherein the selected frequency is reduced to approximately one-half the normal value.

2. The invention described in claim 1 wherein said regions of given type conductivity comprise independent layers of semiconductor material disposed on opposite sides of said regions of opposite type conductivity, whereby a sandwich-type semiconductor device is formed,
   and wherein said region of opposite type conductivity comprises a resistance element between said pair of terminals, whereby said capacitors and said resistance element combine to form a resistance-capacitance circuit between said three terminals.

References Cited by the Examiner

UNITED STATES PATENTS

| | | | |
|---|---|---|---|
| 2,820,154 | 1/1958 | Kurshan | 330—37 |
| 3,022,472 | 2/1962 | Tannenbaum et al. | 333—18 |
| 3,060,327 | 10/1962 | Dacey | 307—88.5 |
| 3,070,762 | 12/1962 | Evans | 317—235 |
| 3,148,344 | 9/1964 | Kaufman | 333—70 |

OTHER REFERENCES

Science, vol. 132, Oct. 21, 1960, "Integration of Circuit Functions," by S. W. Herwald et al., pages 1127–33.

Proc. IRE, September 1960, pages 1540–42, W. M. Kaufman, Monolithic Null Device.

HERMAN KARL SAALBACH, *Primary Examiner.*

ELI LIEBERMAN, C. BARAFF, *Assistant Examiners.*